US012808031B2

(12) United States Patent
Jang et al.

(10) Patent No.: US 12,808,031 B2
(45) Date of Patent: Nov. 24, 2026

(54) DEPOSITION APPARATUS INCLUDING MASK ASSEMBLY AND SHAPE CORRECTION METHOD FOR MASK ASSEMBLY

(71) Applicant: Samsung Display Co., LTD., Yongin-si (KR)

(72) Inventors: Wonyoung Jang, Yongin-si (KR); Jongdae Lee, Yongin-si (KR); Soohyun Min, Yongin-si (KR); Mina Woo, Yongin-si (KR); Seungju Hong, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 425 days.

(21) Appl. No.: 18/389,138

(22) Filed: Nov. 13, 2023

(65) Prior Publication Data

US 2024/0191337 A1 Jun. 13, 2024

(30) Foreign Application Priority Data

Dec. 8, 2022 (KR) ........................ 10-2022-0170195

(51) Int. Cl.
*C23C 14/04* (2006.01)
*C23C 14/24* (2006.01)
*H10K 71/16* (2023.01)

(52) U.S. Cl.
CPC ............ *C23C 14/042* (2013.01); *C23C 14/24* (2013.01); *H10K 71/166* (2023.02)

(58) Field of Classification Search
CPC ...... C23C 14/042; C23C 14/24; H10K 71/166
USPC .......................................................... 118/721
See application file for complete search history.

(56) References Cited

U.S. PATENT DOCUMENTS

| | | | | |
|---|---|---|---|---|
| 7,618,674 B2 | 11/2009 | Kang et al. | | |
| 2015/0114293 A1* | 4/2015 | Chung | C23C 16/042 | 118/721 |
| 2016/0186317 A1* | 6/2016 | Han | C23C 16/042 | 118/721 |

(Continued)

FOREIGN PATENT DOCUMENTS

| | | | |
|---|---|---|---|
| CN | 106098293 A * | 11/2016 | A63H 33/06 |
| CN | 121381296 A * | 1/2026 | |
| KR | 100696472 B1 | 3/2007 | |

(Continued)

*Primary Examiner* — Parviz Hassanzadeh
(74) *Attorney, Agent, or Firm* — CANTOR COLBURN LLP

(57) ABSTRACT

A deposition apparatus includes: a chamber; a stage defining a stage-opening therein and disposed inside the chamber; a frame disposed on the stage and defining a frame-opening therein corresponding to the stage-opening; a mask coupled to the frame and defining a plurality of deposition openings therein corresponding to the frame-opening; a deposition source configured to spray a deposition material to the frame-opening; alignment units coupled to the stage and contacting the frame to move a position of the frame on the stage; and correction units each of which includes a magnetic force part disposed on the stage and adjacent to the frame, and a driving part configured to provide a magnetic force to the magnetic force part, wherein the correction units are configured to change a shape of the frame, and are coupled to the stage.

14 Claims, 15 Drawing Sheets

(56) References Cited

U.S. PATENT DOCUMENTS

2017/0342541 A1 11/2017 Bangert et al.

FOREIGN PATENT DOCUMENTS

| | | | |
|---|---|---|---|
| KR | 101205818 | B1 | 11/2012 |
| KR | 102019490 | B1 | 9/2019 |
| KR | 1020200017381 | A | 2/2020 |
| KR | 102153644 | B1 | 9/2020 |
| KR | 1020210057117 | A | 5/2021 |
| KR | 102261034 | B1 | 6/2021 |
| KR | 1020210126147 | A | 10/2021 |

* cited by examiner

DEPOSITION APPARATUS INCLUDING MASK ASSEMBLY AND SHAPE CORRECTION METHOD FOR MASK ASSEMBLY

This application claims priority to Korean Patent Application No. 10-2022-0170195, filed on Dec. 8, 2022, and all the benefits accruing therefrom under 35 U.S.C. § 119, the content of which in its entirety is herein incorporated by reference.

BACKGROUND

The present disclosure herein relates to a deposition apparatus including a mask assembly and a shape correction method for a mask assembly, and more particularly, to a mask assembly used in a deposition process for manufacturing a display panel through a deposition apparatus, and a shape correction method for a mask assembly.

A display apparatus such as televisions, portable phones, tablet computers, car navigation systems, and game consoles may include a display panel in order to display images. The display panel may include a plurality of pixels. Each of the pixels may include a driving element such as a transistor, and a display element such as an organic light-emitting diode. The display element may be formed by depositing an electrode and a light-emitting pattern on a substrate.

The light-emitting pattern may be patterned using a mask, in which deposition openings are defined, to be formed in a predetermined region. A deposition process technology using a large-area mask is being developed in order to improve the production yield of a display panel. However, there is a limitation in that the accuracy of the position where the light-emitting pattern is formed may be lowered when the mask fails to be aligned to a required position in a deposition apparatus.

SUMMARY

The present disclosure provides a mask assembly used in a deposition process of a large-area panel, and a shape correction method for a mask assembly. The present disclosure also provides a mask assembly with improved deposition accuracy.

An embodiment of the invention provides a deposition apparatus including: a chamber: a stage defining a stage-opening, and disposed inside the chamber; a frame disposed on the stage, and defining a frame-opening therein corresponding to the stage-opening: a mask coupled to the frame, and defining a plurality of deposition openings therein corresponding to the frame-opening: a deposition source configured to spray a deposition material to the frame-opening; alignment units coupled to the stage and contacting the frame to move a position of the frame on the stage; and correction units each of which includes a magnetic force part disposed on the stage and adjacent to the frame, and a driving part configured to provide a magnetic force to the magnetic force part, wherein the correction units are configured to change a shape of the frame and are coupled to the stage.

In an embodiment, the magnetic force part may not be in contact with the frame in a first mode, and may be in contact with a corresponding side of the frame in a second mode, and in the second mode, the magnetic force part may contract the frame in a direction toward the frame-opening, or expand the frame, through the magnetic force provided from the driving part.

In an embodiment, a shape of the frame-opening may be changed to correspond to a shape of the frame when the shape of the frame is changed.

In an embodiment, the magnetic forces applied to the respective magnetic force parts may be different from each other in strength.

In an embodiment, each of the correction units may further include an extension part disposed between the magnetic force part and the driving part, and which changes in length on the stage.

In an embodiment, the frame may include a first part and a second part extending in a first direction and spaced apart from each other in a second direction crossing the first direction, and a third part and a fourth part extending in the second direction and spaced apart from each other in the first direction, and connected to the first part and the second part to define the frame-opening, and some of the correction units may be disposed adjacent to the first part to be spaced apart from each other along the first direction.

In an embodiment, others of the correction units may be disposed adjacent to the second part to be spaced apart from each other along the second direction, and a remainder of the correction units may be disposed adjacent to the third part to be spaced apart from each other along the second direction.

In an embodiment, a length of each of the third part and the fourth part in the second direction may be smaller than a length of the first part in the first direction, and the number of the correction units disposed adjacent to each of the third part and the fourth part may be equal to or greater than the number of the correction units disposed adjacent to the first part.

In an embodiment, the alignment units may be disposed on the first part to be spaced apart from each other along the first direction, and the alignment units may each be individually operated.

In an embodiment, each of the alignment units may move the frame in the second direction.

In an embodiment, the mask and the frame may each include Invar.

In an embodiment of the invention, a mask assembly includes: a stage defining a stage-opening: a frame disposed on the stage, and defining a frame-opening therein corresponding to the stage-opening: a mask coupled to the frame, and defining a plurality of deposition openings therein corresponding to the frame-opening; alignment units coupled to the stage: and correction units each of which includes a magnetic force part disposed on the stage to be adjacent to the frame, and a driving part configured to provide a magnetic force to the magnetic force part, wherein the correction units are coupled to the stage. The alignment units move a position of the frame on the stage, and the correction units change a shape of the frame.

In an embodiment, the magnetic force part may not be in contact with the frame in a first mode, and may be in contact with a corresponding side of the frame in a second mode, and in the second mode, the magnetic force part may contract the frame in a direction toward the frame-opening, or expand the frame, through the magnetic force provided from the driving part.

In an embodiment, a shape of the frame-opening may be changed to correspond to a shape of the frame when the shape of the frame is changed.

In an embodiment of the invention, a shape correction method for a mask assembly includes: disposing a frame, defining a frame-opening therein, on a stage to which alignment units and correction units are coupled: controlling a position of the frame on the stage by the alignment units, and correcting a shape of the frame by the correction units.

In an embodiment, each of the correction units may include a driving part configured to generate a magnetic force and a magnetic force part connected to the driving part to receive the magnetic force from the driving part, and the correcting of the shape of the frame may include: pressing the magnetic force parts against the frame, and providing the magnetic force generated from the driving part to the magnetic force part.

In an embodiment, each of the magnetic force parts may be individually operated by a corresponding driving part, and in the providing of the magnetic force to the magnetic force part, the magnetic force part may contract the frame in a direction toward the frame-opening, or expand the frame.

In an embodiment, the shape correction method may further include coupling at least one mask defining deposition openings therein onto the frame.

In an embodiment, the coupling of the at least one mask may be performed after the correcting of the shape of the frame, and the correcting of the shape of the frame may restore a correct shape of the frame from a distorted shape of the frame using alignment holes defined in the frame.

In an embodiment, the coupling of the at least one mask may be performed before the disposing of the frame on the stage, and the correcting of the shape of the frame may restore a correct shape of the frame from a distorted shape of the frame by determining an alignment accuracy of the deposition openings.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
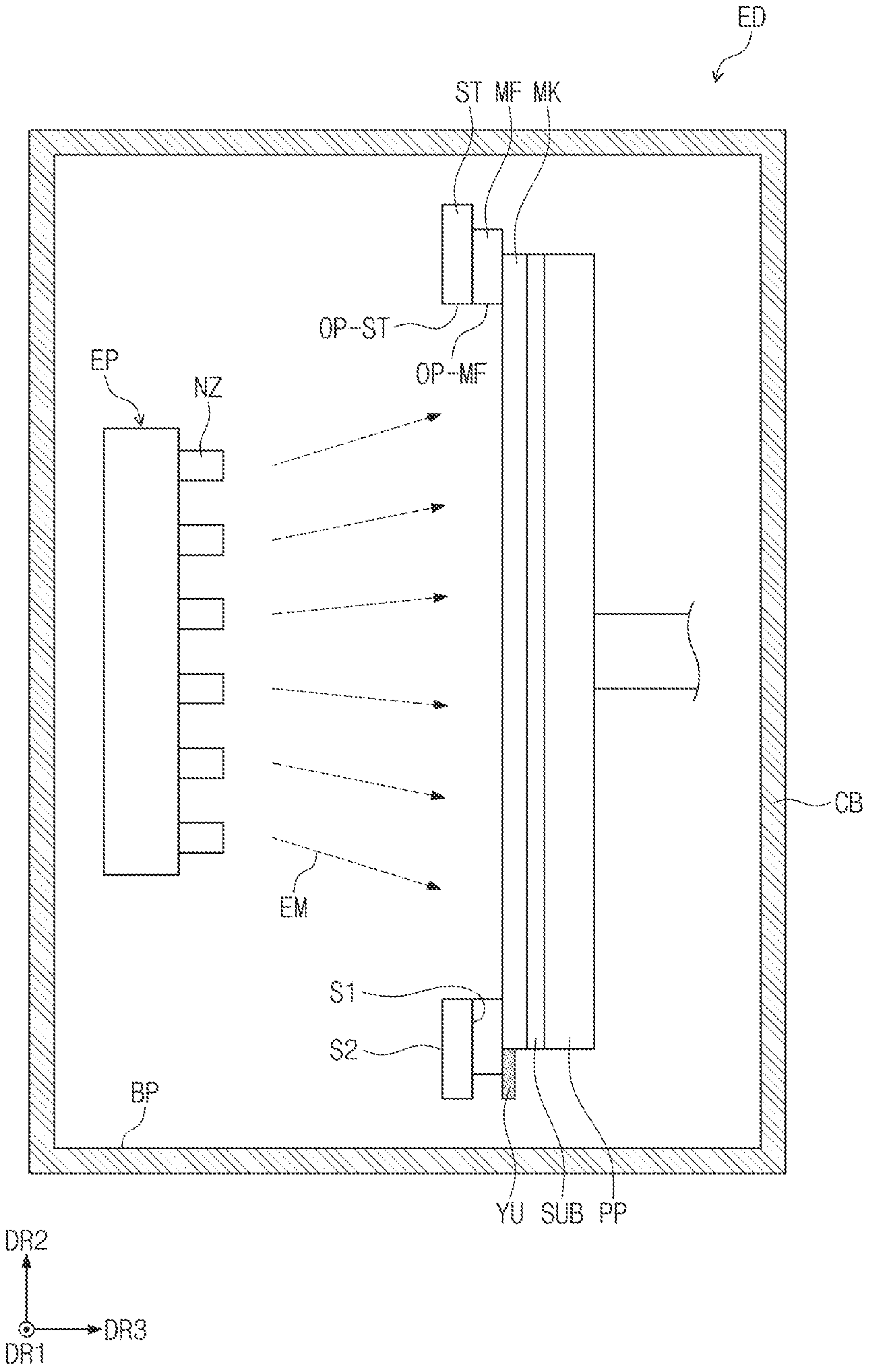
FIG. 1 is a cross-sectional view of a deposition apparatus according to an embodiment of the invention.

In this specification, it will be understood that when an element (or a region, a layer, a portion, or the like) is referred to as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the invention. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to the accompanying drawings.

Figure 2:
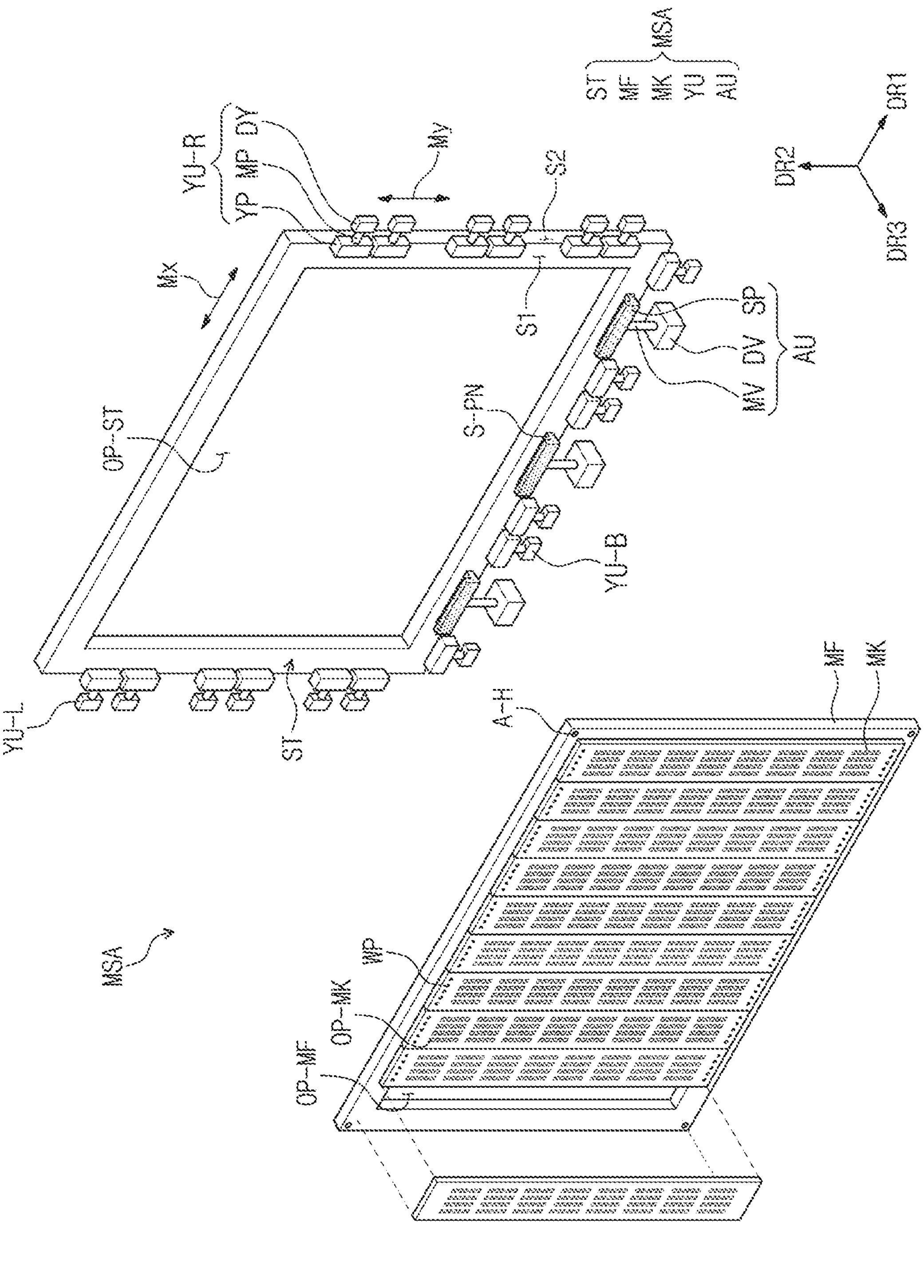
FIG. 2 is an exploded perspective view of a mask assembly according to an embodiment of the invention.
Figure 3:
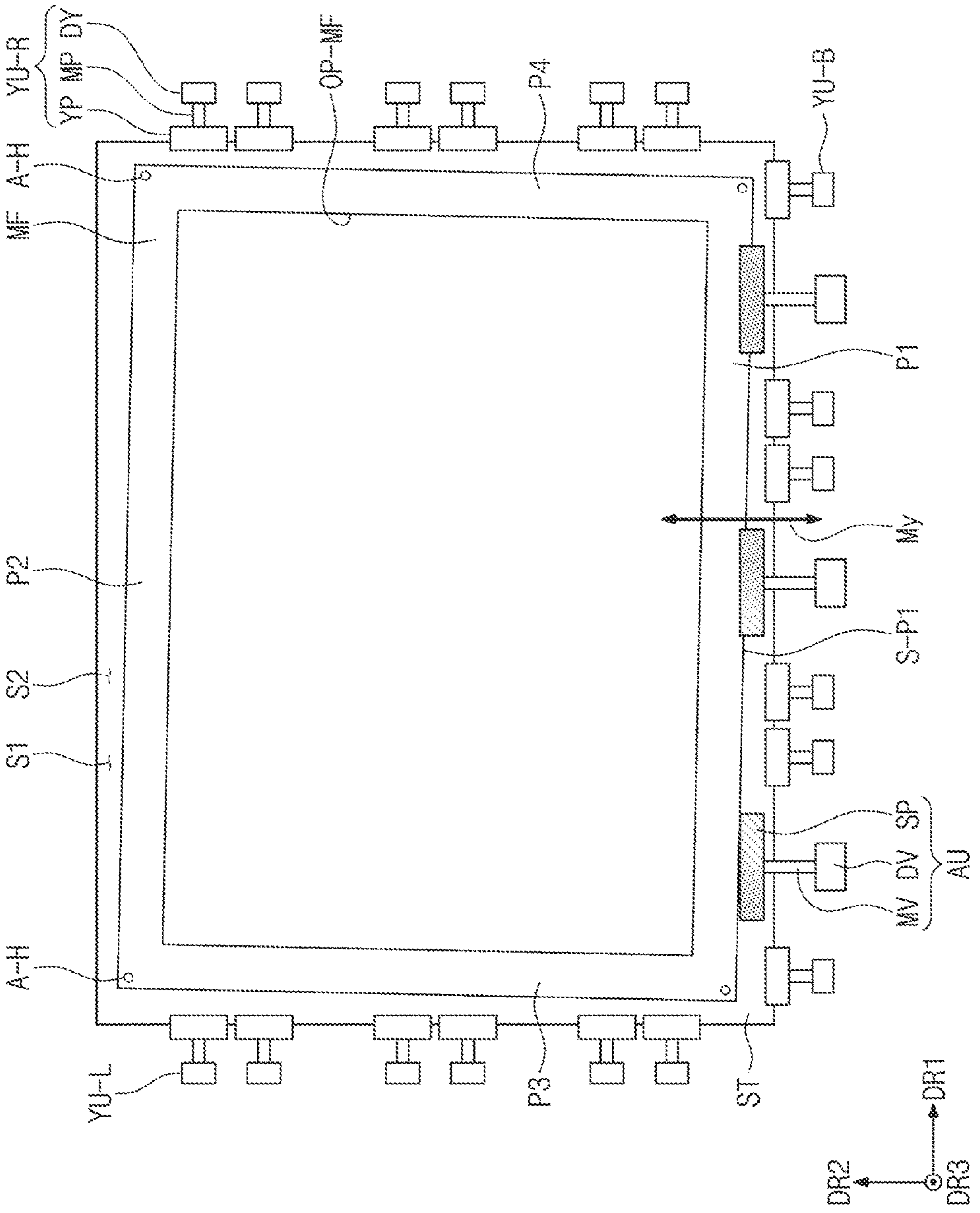
FIG. 3 is a plan view of a mask assembly according to an embodiment of the invention.
Figure 4:
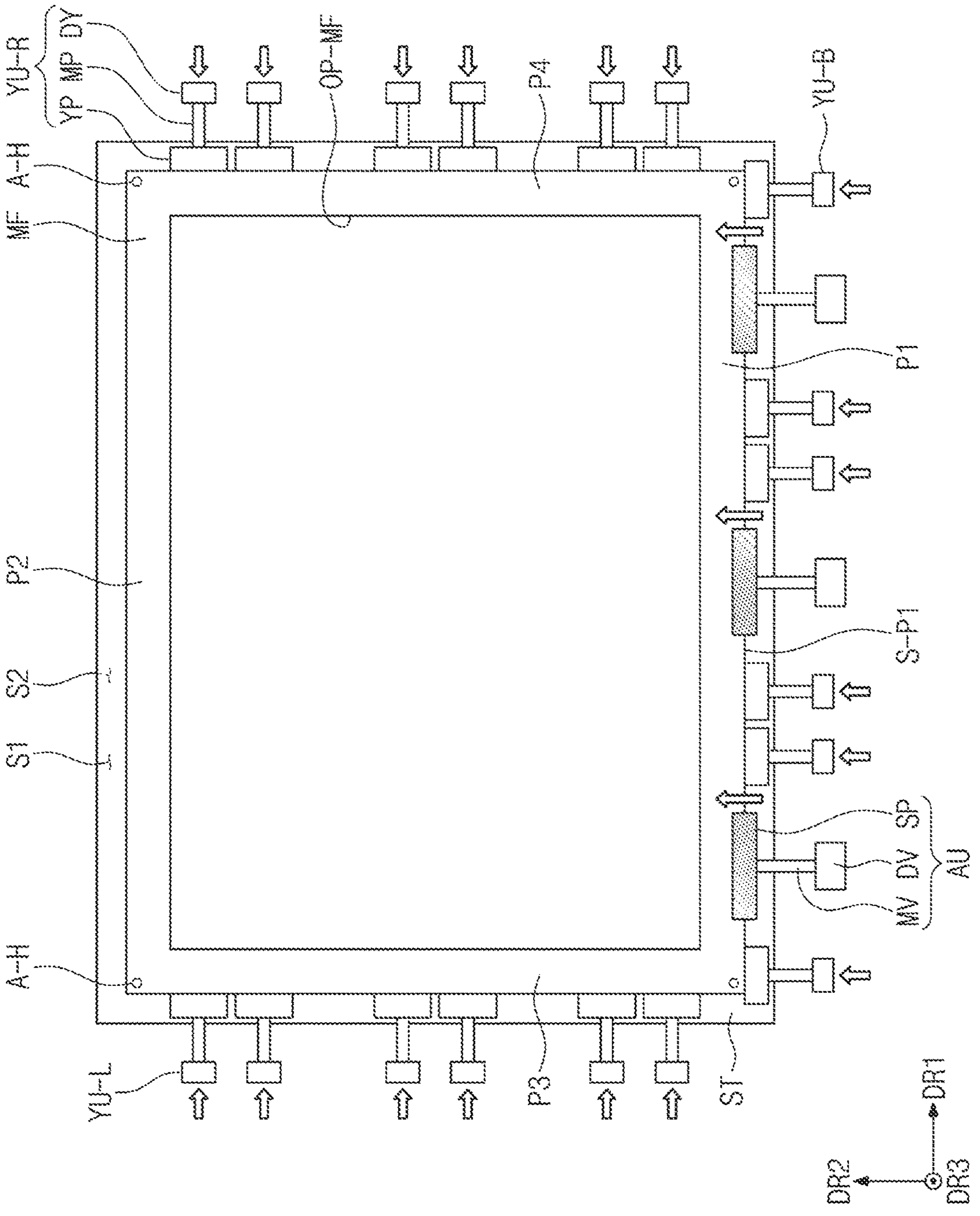
FIG. 4 is a plan view of a mask assembly according to an embodiment of the invention.

FIG. 1 is a cross-sectional view of a deposition apparatus according to an embodiment of the invention. FIG. 2 is an exploded perspective view of a mask assembly according to an embodiment of the invention. FIG. 3 is a plan view of a mask assembly according to an embodiment of the invention. FIG. 4 is a plan view of a mask assembly according to an embodiment of the invention. FIGS. 5A to 5D are plan views of a frame according to an embodiment of the invention. As used herein, the "plan view" is a thickness direction (i.e., third direction DR3) of the frame MF.

Referring to FIGS. 1 and 2, a deposition apparatus ED according to an embodiment may include a chamber CB, a mask MK, a frame MF, a stage ST, a correction unit YU, a deposition source EP, and a fixing member PP. The deposition apparatus ED may further include, in addition to the above-mentioned components, additional mechanical devices for providing an in-line system. The deposition apparatus ED according to an embodiment may further include a coupling member. The coupling member may be fixed to a side wall of the chamber CB, and the stage ST may be connected to the coupling member to be stably fixed inside the chamber CB. Therefore, a deposition process may be stably performed even when the stage ST is vertically disposed due to the coupling member.

The chamber CB may provide an inner space, and the deposition source EP, the mask MK, the frame MF, the stage ST, and the correction units YU may be disposed in the inner space of the chamber CB. The chamber CB may form a sealed space, and set the deposition condition to a vacuum state. The chamber CB may include at least one gate, and may be opened and closed by the gate. The mask MK, the frame MF, and a substrate SUB may enter and exit the chamber CB through the gate provided in the chamber CB.

The chamber CB may include a floor BP, a ceiling, and side walls. The floor BP of the chamber CB may be parallel to a plane defined by a first direction DR1 and a third direction DR3, and the normal direction of the floor BP of the chamber CB may be parallel to a second direction DR2.

The fixing member PP may be disposed inside the chamber CB, and face the deposition source EP in the third direction DR3. The fixing member PP may bring the substrate SUB into close contact with the mask MK. The fixing member PP may include magnetic substances for bringing the mask MK and the substrate SUB into close contact with each other. In an embodiment, for example, the magnetic substances may generate magnetic forces to fix the mask MK, and the substrate SUB disposed between the mask MK and the fixing member PP may come into close contact with the mask MK. However, an embodiment of the invention is not limited thereto, and the fixing member PP may include a jig or robot arm that holds the mask MK.

The substrate SUB may be disposed between the mask MK and the fixing member PP. The substrate SUB may be a target object on which a deposition material is to be deposited. The substrate SUB may include a support substrate and a synthetic resin layer disposed on the support substrate. The support substrate may be removed later in a manufacturing process of a display panel DP (see FIG. 8), and the synthetic resin layer may correspond to a base layer BL of FIG. 8. According to a configuration formed through a deposition process, the substrate SUB may include a partial configuration of the display panel DP (see FIG. 8) formed on the base layer BL (see FIG. 8).

The deposition source EP may be disposed inside the chamber CB, and face the fixing member PP in the third direction DR3. The deposition source EP may include a storage space where a deposition material EM is accommodated, and at least one nozzle NZ. The deposition material EM may include an inorganic material, metal, or an organic material which is sublimable or vaporable. In an embodiment, for example, the deposition material EM may include an organic light-emitting material to form a light-emitting pattern EML (see FIG. 8). The sublimed or vaporized deposition material EM may be sprayed through the nozzle NZ toward the substrate SUB. The deposition material EM may pass through deposition openings OP-MK defined in the mask MK, and may be deposited to form a pattern on the substrate SUB.

The stage ST may be disposed between the deposition source EP and the fixing member PP. The stage ST may be disposed in a moving path of the deposition material EM supplied from the deposition source EP to the substrate SUB while supporting a rear surface of the frame MF. The stage ST may define a stage-opening OP-ST therein. The deposition material EM may pass through the stage-opening OP-ST to be provided to the mask MK. On edges of the stage ST, coupling grooves may be defined to be fixed to the aforementioned coupling member. Through the coupling grooves, the stage ST may be fixed to the coupling member by bolting.

The stage ST may include a seating surface S1 on which the frame MF is seated and a rear surface S2 opposed to the seating surface S1. The seating surface S1 and the rear surface S2 of the stage ST may each be a surface parallel to the first direction DR1 and the second direction DR2. The seating surface S1 and the rear surface S2 of the stage ST may be provided substantially perpendicular to the floor BP of the chamber CB. Accordingly, respective rear surfaces of the frame MF and the mask MK disposed on the seating surface S1 of the stage ST may be provided substantially perpendicular to the floor BP of the chamber CB during a deposition process. Therefore, in a vertical-type deposition process, a large-area mask MK may be prevented from sagging caused by gravity, thereby improving deposition reliability.

However, an embodiment of the invention is not limited thereto, and the seating surface S1 and the rear surface S2 of the stage ST according to an embodiment may be provided substantially in parallel to the floor BP of the chamber CB in another embodiment, and the respective rear surfaces of the frame MF and the mask MK may be provided substantially in parallel to the floor BP of the chamber CB during a horizontal-type deposition process in the embodiment.

The frame MF may be coupled to the mask MK, and support the mask MK. The frame MF may include an upper surface facing the mask MK, a rear surface opposed to the upper surface and facing the seating surface S1 of the stage ST, and side surfaces connecting the upper surface to the rear surface thereof. The frame MF may have a shape of a rectangular frame in a plan view. Accordingly, the frame MF may define a frame-opening OP-MF therein overlapping the stage-opening OP-ST in a plan view. The deposition material EM may pass through the frame-opening OP-MF to be provided to the mask MK. The frame MF may define alignment holes A-H therein. The alignment holes A-H may each be disposed on a corresponding edge among the edges of the frame MF.

The frame MF may have a predetermined rigidity. In an embodiment, for example, the frame MF may include a metal material such as stainless steel ("SUS"), Invar, nickel (Ni), and cobalt (Co).

The mask MK may be disposed between the substrate SUB and the frame MF. The mask MK may provide deposition openings OP-MK that define a deposition region. The deposition openings OP-MK may overlap the frame-opening OP-MF in a plan view. The deposition material EM may pass through the deposition openings OP-MK to form a pattern on the substrate SUB.

The mask MK may be provided in plurality and disposed on the frame MF. FIG. 2 illustrates that ten masks MK are arranged along a first direction DR1, but the shape and the number of the masks MK are not limited to any one embodiment. The masks MK may each include Invar.

The masks MK may be coupled to the frame MF. In an embodiment, for example, the masks MK may be coupled to the frame MF through a welding process. In an embodiment, for example, opposite ends of each of the masks MK may be disposed on the frame MF, and the masks MK and the frame MF may be coupled together by performing a welding process on the opposite ends of each of the masks MK. Welding protrusions WP may be formed on the opposite ends of each of the masks MK due to the welding process.

The deposition apparatus ED according to an embodiment may include alignment units AU and a correction unit YU disposed on the stage ST. Herein, a "mask assembly MSA" may be defined as a member including a stage ST, a frame MF, masks MK, a correction unit YU, and alignment units AU.

The alignment units AU may be disposed on a lower end portion of the stage ST in FIG. 2. The alignment units AU may be disposed on the lower end portion of the stage ST to be spaced apart from each other along the first direction DR1. However, an embodiment of the invention is not limited thereto, and the alignment units AU may also be disposed on sidewall portions of the stage ST extending in a second direction DR2, but are not limited to any one embodiment.

Each of the alignment units AU may include a supporting part SP, a driving part DV, and a movement part MV. The frame MF may be seated on the supporting part SP, and the supporting part SP may support the stage ST against a gravity direction. The movement part MV may be a member that connects the supporting part SP to the driving part DV. The movement part MV may change in length in the second direction DR2. The movement part MV may include a robot arm and the like. The driving part DV may drive the movement part MV to move the supporting part SP in a vertical direction My (i.e., the second direction DR2).

The alignment units AU additionally disposed on the sidewall portions of the stage ST (not shown) may move the supporting part in a horizontal direction Mx (i.e., the first direction DR1). The driving part DV may include an electric motor or a piezoelectric element. However, this is only an example, and the type of the driving part DV is not limited as long as being capable of moving the supporting part SP and the movement part MV in the vertical direction My or in the horizontal direction Mx. The alignment units AU may each be individually operated.

The correction unit YU may include first to third correction units YU-B, YU-L, and YU-R. The first correction units YU-B may be disposed on the lower end portion of the stage ST. The second correction units YU-L may be disposed on the left sidewall portion of the stage ST. The third correction units YU-R may be disposed on the right sidewall portion of the stage ST. The first to third correction units YU-B, YU-L, and YU-R may each include a driving part DY, a magnetic force part YP, and an extension part MP. In an embodiment, the number of each of the second correction units YU-L and the third correction units YU-R may be equal to or greater than the number of the first correction units YU-B.

The driving part DY may receive current to form a magnetic force, and provide the magnetic force to the magnetic force part YP through the extension part MP. In addition, the driving part DY may change the length of the extension part MP in the vertical direction My or in the horizontal direction Mx through an electric motor or the like. In an embodiment, for example, the extension part MP included in each of the first correction units YU-B may be contracted or expanded in the vertical direction My, and the extension part MP included in each of the second correction units YU-L and the third correction units YU-R may be contracted or expanded in the horizontal direction Mx.

The magnetic force parts YP included in the first to third correction units YU-B, YU-L, and YU-R may be disposed on the stage ST to be adjacent to the frame MF. The magnetic force parts YP may be spaced apart from each other with a predetermined distance therebetween to surround the frame MF.

By the extension part MP, the magnetic force part YP may be disposed on the stage ST not to be in contact with the frame MF in one state, and disposed on the stage ST to be in contact with the frame MF in another state. In addition, the magnetic force part YP may change the shape of the frame MF through the magnetic force provided from the driving part DY in one state, and the magnetic force may not be generated in another state. The first to third correction units YU-B, YU-L, and YU-R may each be individually operated on the stage ST.

According to this specification, a "first mode" may be defined as a state where the magnetic force parts YP included in the first to third correction units YU-B, YU-L, and YU-R are not in contact with the frame MF. A "second mode" may be defined as a state where the magnetic force parts YP are in contact with the frame MF by the corresponding driving parts DY and extension parts MP. In the second mode, the magnetic force parts YP may change the shape of the frame MF through the magnetic forces provided from the corresponding driving parts DY.

Functions of the alignment units AU will be described with reference to FIGS. 3 and 4. Referring to FIG. 3, when the frame MF is seated on the stage ST, the frame MF may not be disposed at a preset position on the stage ST but disposed on the stage ST in a misaligned state. When the frame MF fails to be seated on the correct position of the stage ST, the masks MK may be coupled to the frame MF in a misaligned state, thereby resulting in a decrease in deposition accuracy. FIG. 3 exemplarily illustrates that the frame MF is seated on the stage ST in a misaligned state, and the frame MF may also be seated in a different state.

The frame MF may include a lower end part P1 and an upper end part P2 each extending approximately in a first direction DR1 and spaced apart from each other in a second direction DR2, and a first sidewall part P3 and a second sidewall part P4 each extending approximately in the second direction DR2, spaced apart from each other in the first direction DR1, and each connected to the lower end part P1 and the upper end part P2 to define the frame-opening OP-MF in the misaligned state. In an embodiment, the length of each of the lower end part P1 and the upper end part P2 in the first direction DR1 may be greater than the length of each of the first sidewall part P3 and the second sidewall part P4 in the second direction DR2.

The alignment units AU may be disposed on the lower end part P1 and spaced apart from each other in the first direction DR1. The alignment units AU may each be individually operated according to the planar distortion degree by which the frame MF is distorted in a plan view. In an embodiment, for example, the alignment units AU disposed on the right side of the lower end part P1 may apply an external force to a lower surface S-P1 to move the right side of the lower end part P1 upward in the vertical direction My (the second direction DR2). FIG. 4 illustrates that the frame MF is disposed on the stage ST in an aligned state through the alignment units AU.

According to an embodiment of the invention, by including the alignment units AU each individually operated to control the position of the frame MF on the stage ST, it may be possible to provide the deposition apparatus ED (see FIG. 1) including the mask assembly MSA (see FIG. 2) with improved deposition accuracy.

Referring to FIG. 4, the second mode may proceed in a state where the frame MF is aligned on the stage ST. That is, the magnetic force part YP of each of the first to third correction units YU-B, YU-L, and YU-R may be in contact with the corresponding side surface of the frame MF. The first to third correction units YU-B, YU-L, and YU-R may each be individually operated. Accordingly, in the second mode, any one among the magnetic force parts YP included in the first to third correction units YU-B, YU-L, and YU-R may be maintained to be non-contact with the frame MF, and the remaining magnetic force parts YP may be in contact with the frame MF.

The magnetic force part YP of each of the first to third correction units YU-B, YU-L, and YU-R may receive the magnetic force through the corresponding driving part DY.

Figure 5A:
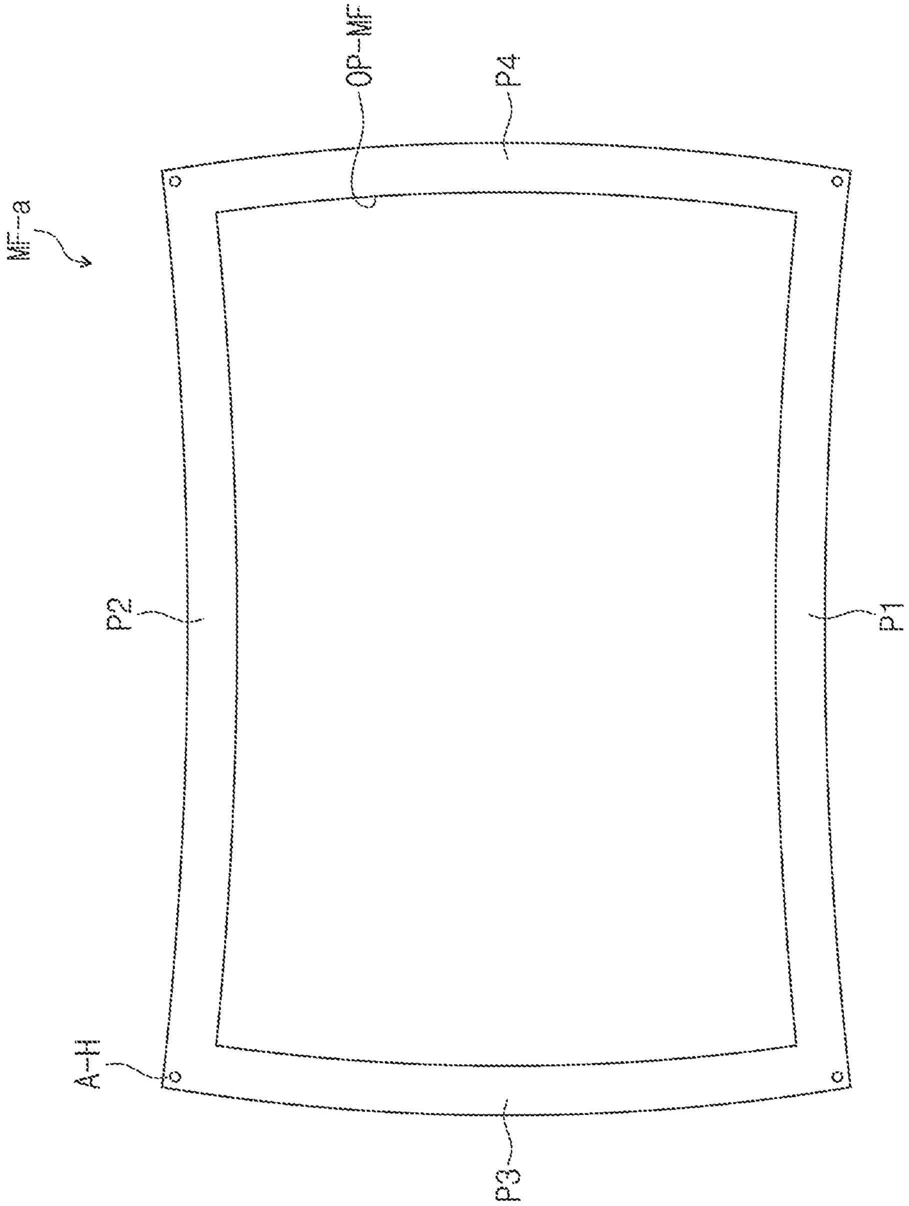
FIGS. 5A to 5D are plan views of a frame according to an embodiment of the invention.
Figure 5B:
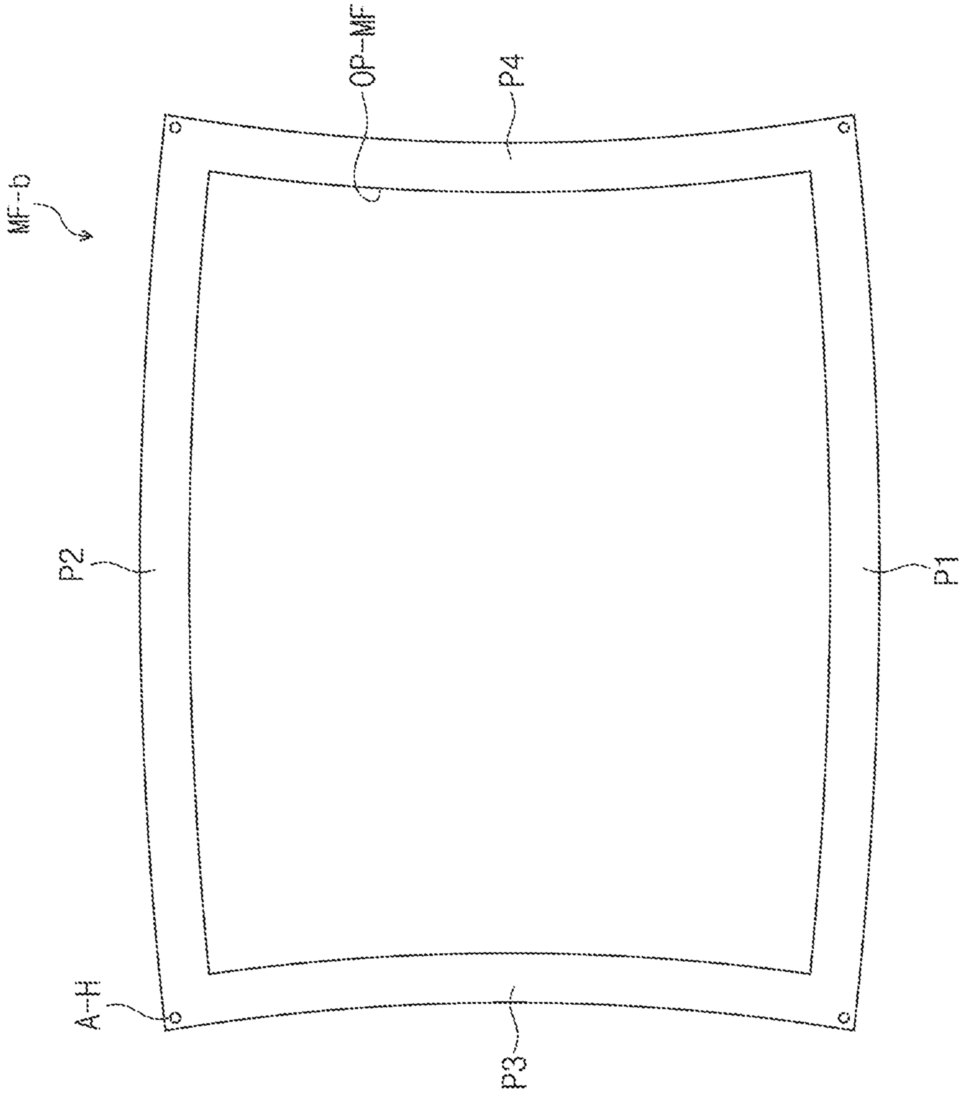
Figure 5C:
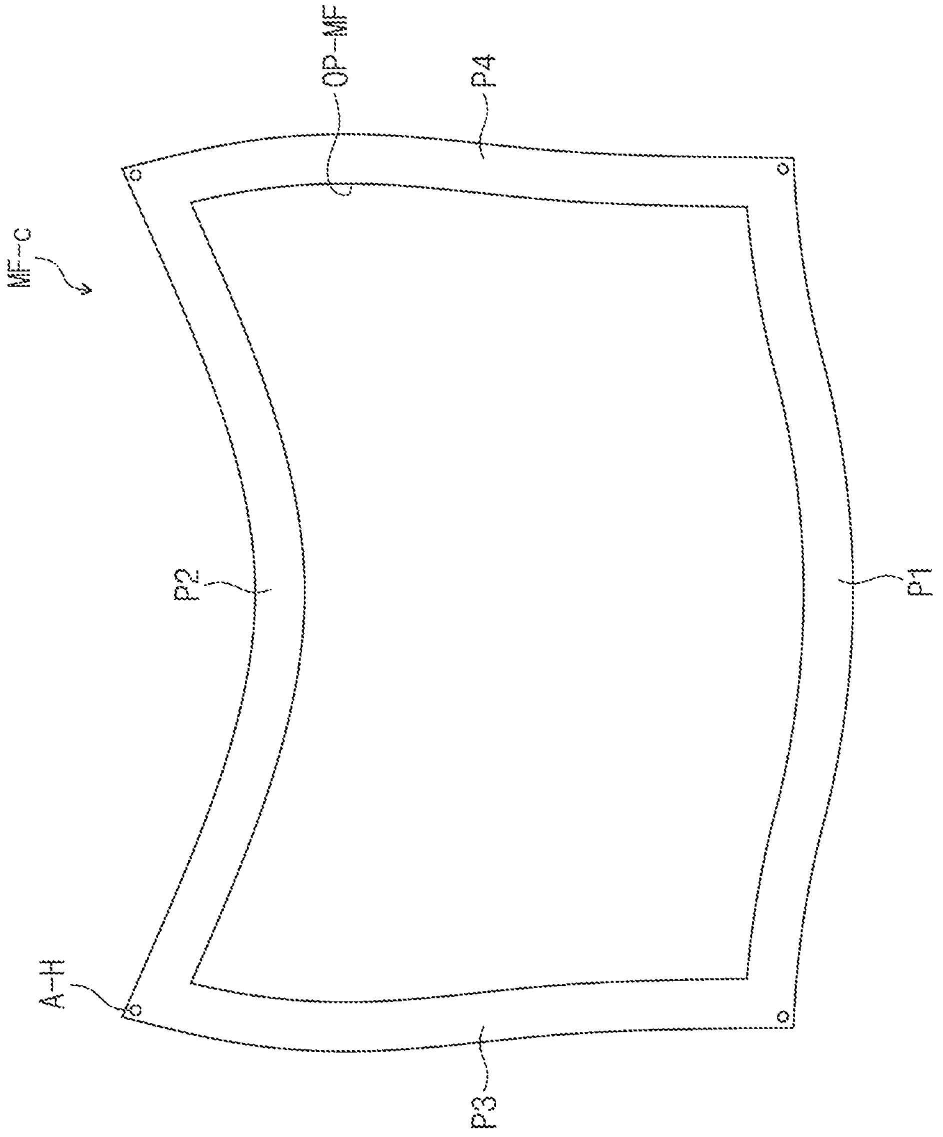
Figure 5D:
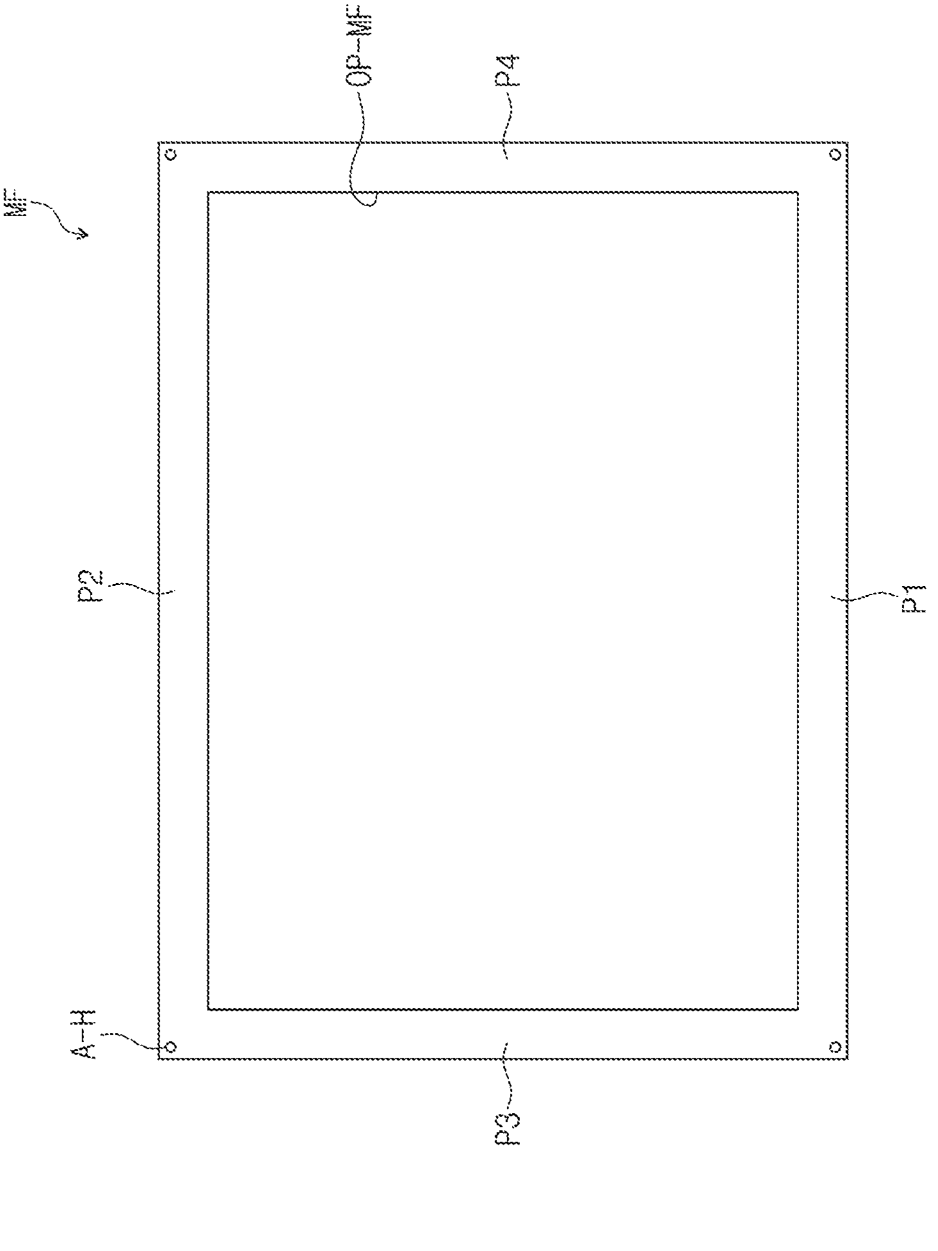

FIGS. 5A to 5C exemplarily illustrate frames MF-a, MF-b, and MF-c before correction, respectively, the shapes of which are changed due to gravity in a state of being disposed on the stage ST while deformed due to intrinsic tensions. FIG. 5D illustrates a frame MF in the normal state.

The frame MF-a, MF-b, MF-c, or MF may include a lower end part P1 and an upper end part P2 each extending in a first direction DR1 and spaced apart from each other in a second direction DR2, and a first sidewall part P3 and a second sidewall part P4 each extending in the second direction DR2 and spaced apart from each other in the first direction DR1, and each connected to the lower end part P1 and the upper end part P2 to define a frame-opening OP-MF. The frames MF-a, MF-b, MF-c, and MF may each define alignment holes A-H therein.

The shape of the frame-opening OP-MF may also be changed to correspond to a distortion of a portion of at least one of the lower end part P1, the upper end part P2, the first sidewall part P3, or the second sidewall part P4 included in each of the frames MF-a, MF-b, or MF-c before correction the shapes of which are changed. Coupling the masks MK onto the frame MF in a state where the shape of the frame-opening OP-MF is changed may lower the deposition accuracy.

First to third correction units YU-B, YU-L, and YU-R may each be individually operated to change, using magnetic forces, the shape of the distorted portion among the lower end part P1, the upper end part P2, the first sidewall part P3, and the second sidewall part P4 to be similar to the shape of the frame MF in the normal state. In an embodiment, for example, the first to third correction units YU-B, YU-L, and YU-R may each contract the frame MF in a direction toward the frame-opening OP-MF, or expand the frame FR in a direction opposite to the direction toward the frame-opening OP-MF.

According to an embodiment of the invention, by including the alignment units AU that control the position of the frame MF on the stage ST and also including the first to third correction units YU-B, YU-L, and YU-R that change the shape of the frame MF, the shape of the large-area frame MF, which has been deformed due to gravity, may be easily corrected in a vertical-type deposition apparatus. Accordingly, quality deterioration of the masks MK to be coupled onto the frame MF may be minimized, and the deposition accuracy may be effectively improved.

Figure 6A:
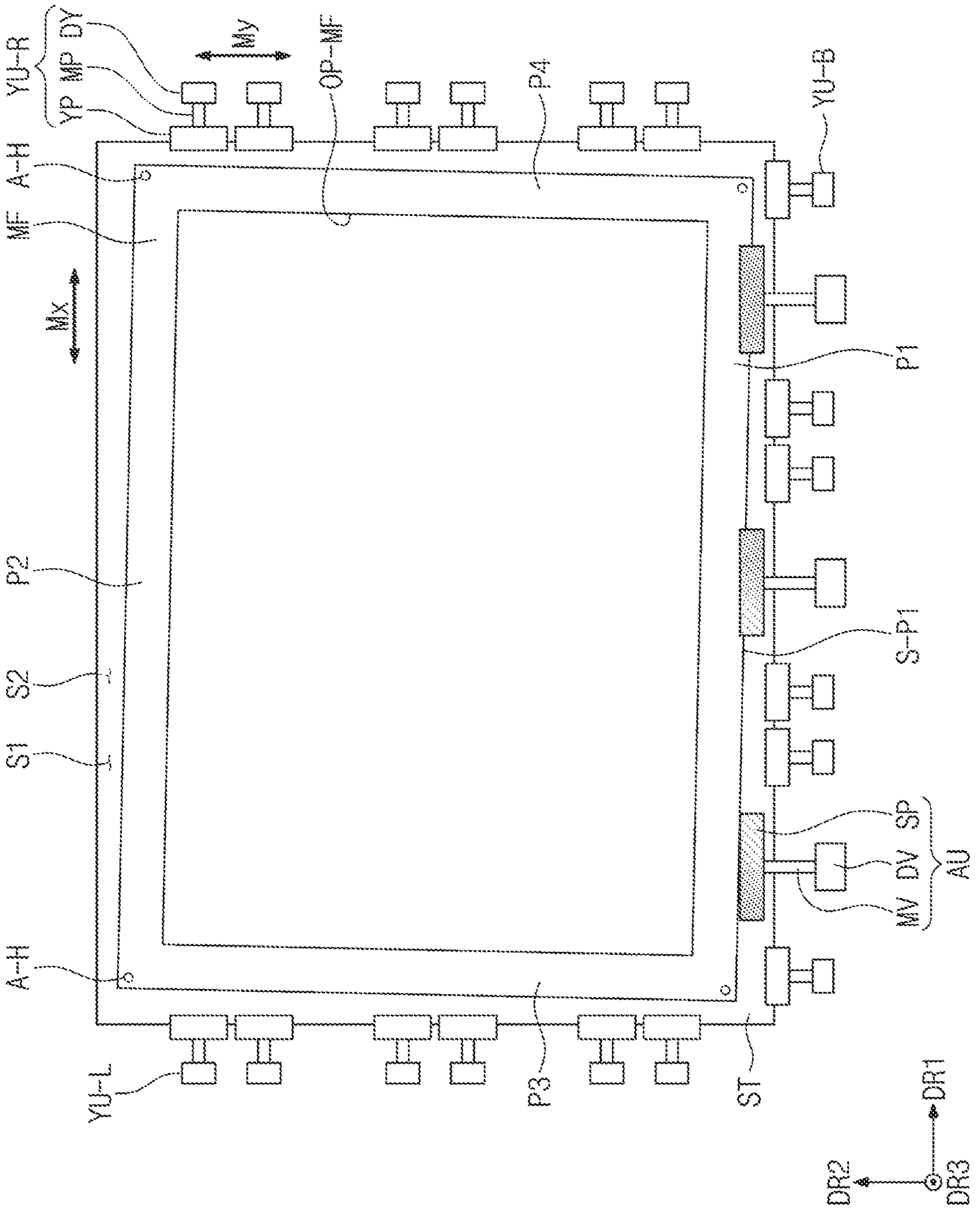
FIGS. 6A to 6C are plan views illustrating a shape correction method for a mask assembly according to an embodiment of the invention.
Figure 6B:
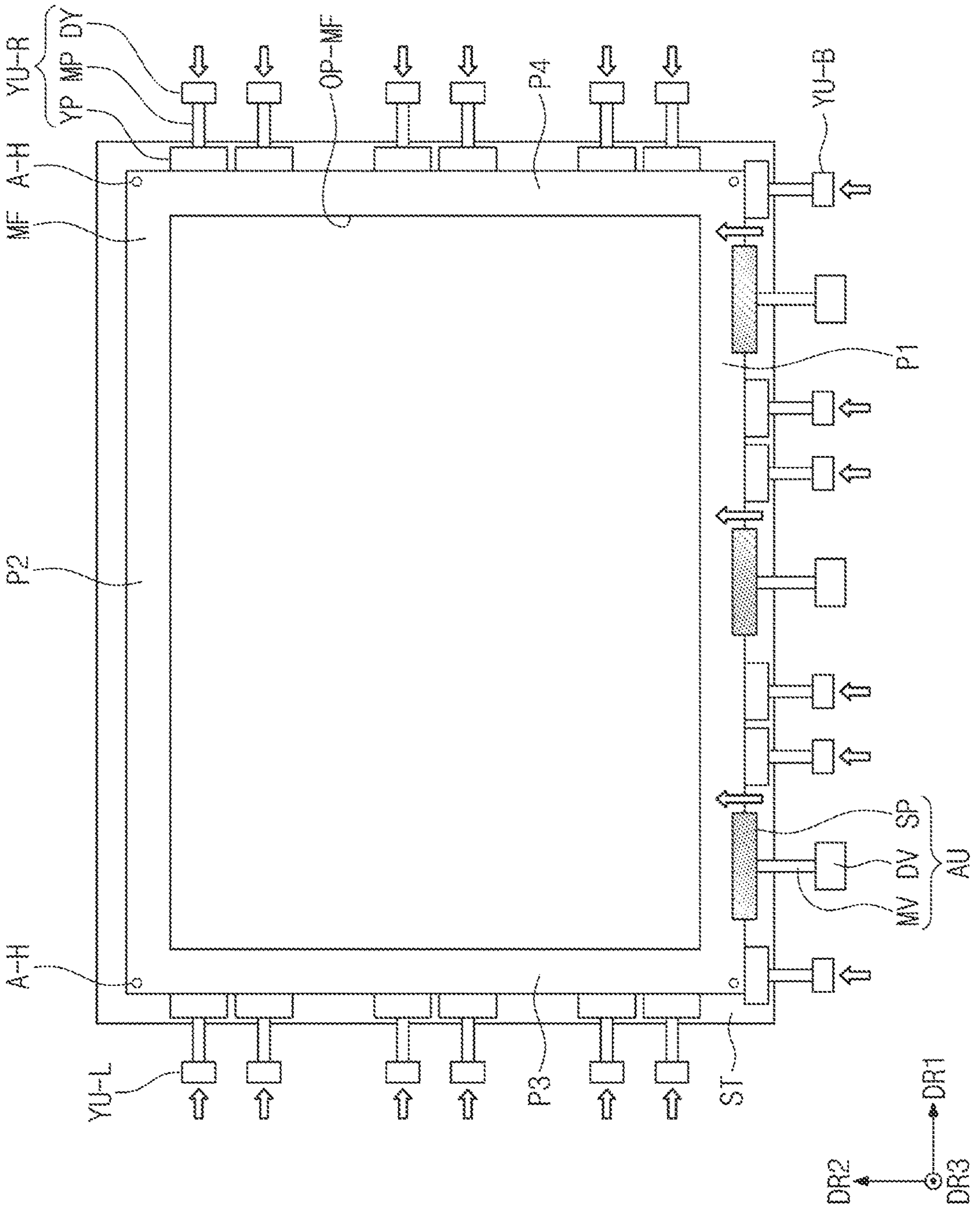
Figure 6C:
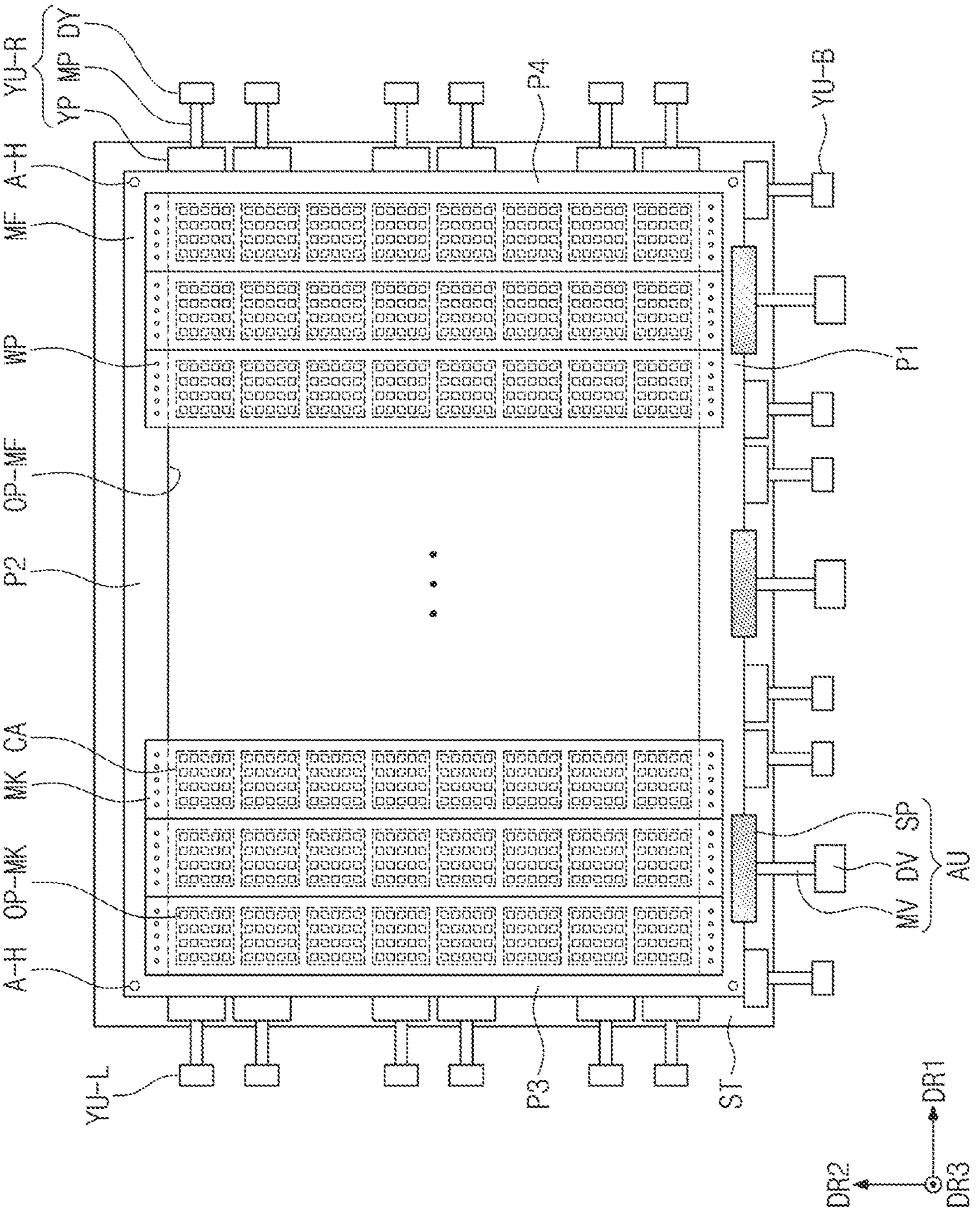

FIG. 6A to 6C are plan views illustrating a shape correction method for a mask assembly according to an embodiment of the invention. The same/similar components as those described with reference to FIGS. 1 to 5D are denoted as the same/similar reference numerals or symbols, and repeated descriptions are omitted.

Referring to FIG. 6A, a shape correction method for a mask assembly according to an embodiment may include disposing, on a stage ST, a frame MF defining a frame-opening OP-MF therein. Alignment units AU and first to third correction units YU-B, YU-L, and YU-R each individually operated may be disposed on the stage ST.

The alignment units AU may each include a supporting part SP, a driving part DV, and a movement part MV. The first to third correction units YU-B, YU-L, and YU-R may each include a driving part DY, a magnetic force part YP, and an extension part MP.

Afterwards, controlling a position of the frame MF on the stage ST through the alignment units AU may be included.

The frame MF may include a lower end part P1 and an upper end part P2 each extending approximately in a first direction DR1 and spaced apart from each other along a second direction DR2, and a first sidewall part P3 and a second sidewall part P4 each extending approximately in the second direction DR2 and spaced apart from each other along the first direction DR1, and each connected to the lower end part P1 and the upper end part P2 to define a frame-opening OP-MF.

In the disposing of the frame MF on the stage ST, the frame MF may be seated on the stage ST in a misaligned state, and at this time, the alignment units AU may each be individually operated to cause the frame MF to be disposed at a preset position on the stage ST. In an embodiment, for example, the alignment units AU disposed on the right side of the lower end part P1 may apply an external force to a lower surface S-P1 to move the right side of the lower end part P1 toward the second direction DR2 (i.e., upward direction).

Thereafter, referring to FIG. 6B, the shape correction method for a mask assembly according to an embodiment may include correcting a shape of the frame MF through the first to third correction units YU-B, YU-L, and YU-R.

The correcting of a shape of the frame MF may include: pressing the magnetic force parts YP against the frame MF, and providing magnetic forces generated from the driving parts DY to the corresponding magnetic force parts YP.

The pressing of the magnetic force parts YP against the frame MF may bring the magnetic force parts YP into close contact with the corresponding lower end part P1, the first sidewall part P3, and the second sidewall part P4 through the extension parts MP in a state where the frame MF is aligned on the stage ST. In the providing of magnetic forces to the magnetic force parts YP, the magnetic forces may be provided to the magnetic force parts YP through the driving parts DY.

Contracting or expanding operations of the extension parts MP may change the shapes of the lower end part P1, the first sidewall part P3, and the second sidewall part P4 closely attached to the magnetic force parts YP, and thus the shape of the frame MF may be corrected. The magnetic force parts YP may be individually operated by the corresponding driving parts, respectively, and may contract the frame MF in a direction toward the frame-opening OP-MF, or expand the frame MF. At this time, whether the shapes of the lower end part P1, the first sidewall part P3, and the second sidewall part P4 are successfully corrected or not may be determined using the alignment holes A-H included in the frame MF. In an embodiment, for example, after the correcting of the shape of the frame MF, a position of each of the alignment holes A-H may be checked using a camera or the like to determine whether or not the shape correction of the frame MF is successful.

Thereafter, referring to FIG. 6C, the shape correction method for a mask assembly according to an embodiment may include coupling the masks MK to the frame MF. The masks MK may each define a plurality of deposition openings OP-MK therein overlapping the frame-opening OP-MF in a plan view.

The masks MK may be coupled to the frame MF by a welding process. In an embodiment, for example, opposite ends of each of the masks MK may be disposed on the frame MF, and the masks MK and the frame MF may be coupled together by performing a welding process on the opposite ends of each of the masks MK. Welding protrusions WP may be formed on the opposite ends of each of the masks MK due to the welding process.

Figure 7A:
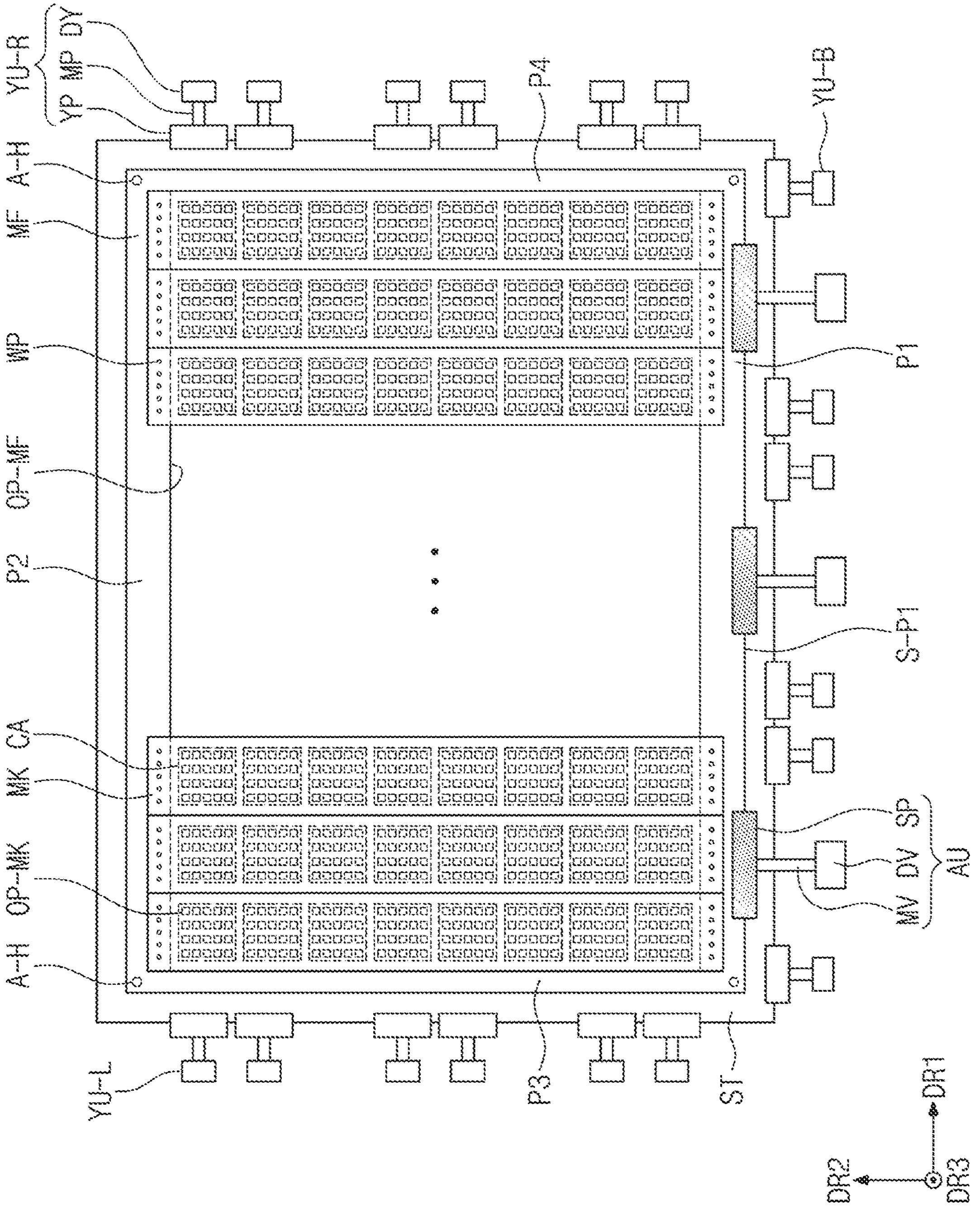
FIGS. 7A and 7B are plan views illustrating a shape correction method for a mask assembly according to an embodiment of the invention.
Figure 7B:
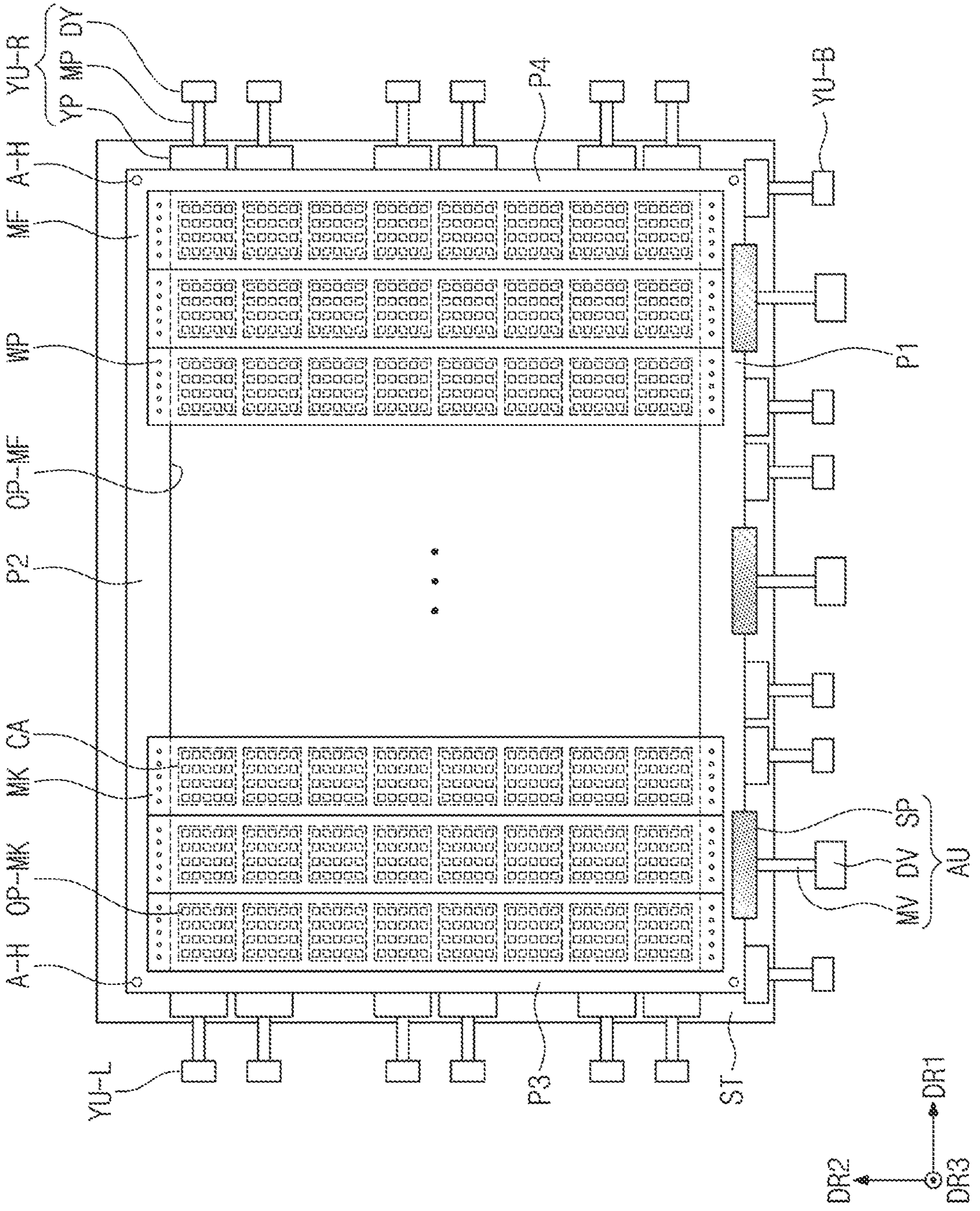
Figure 7C:
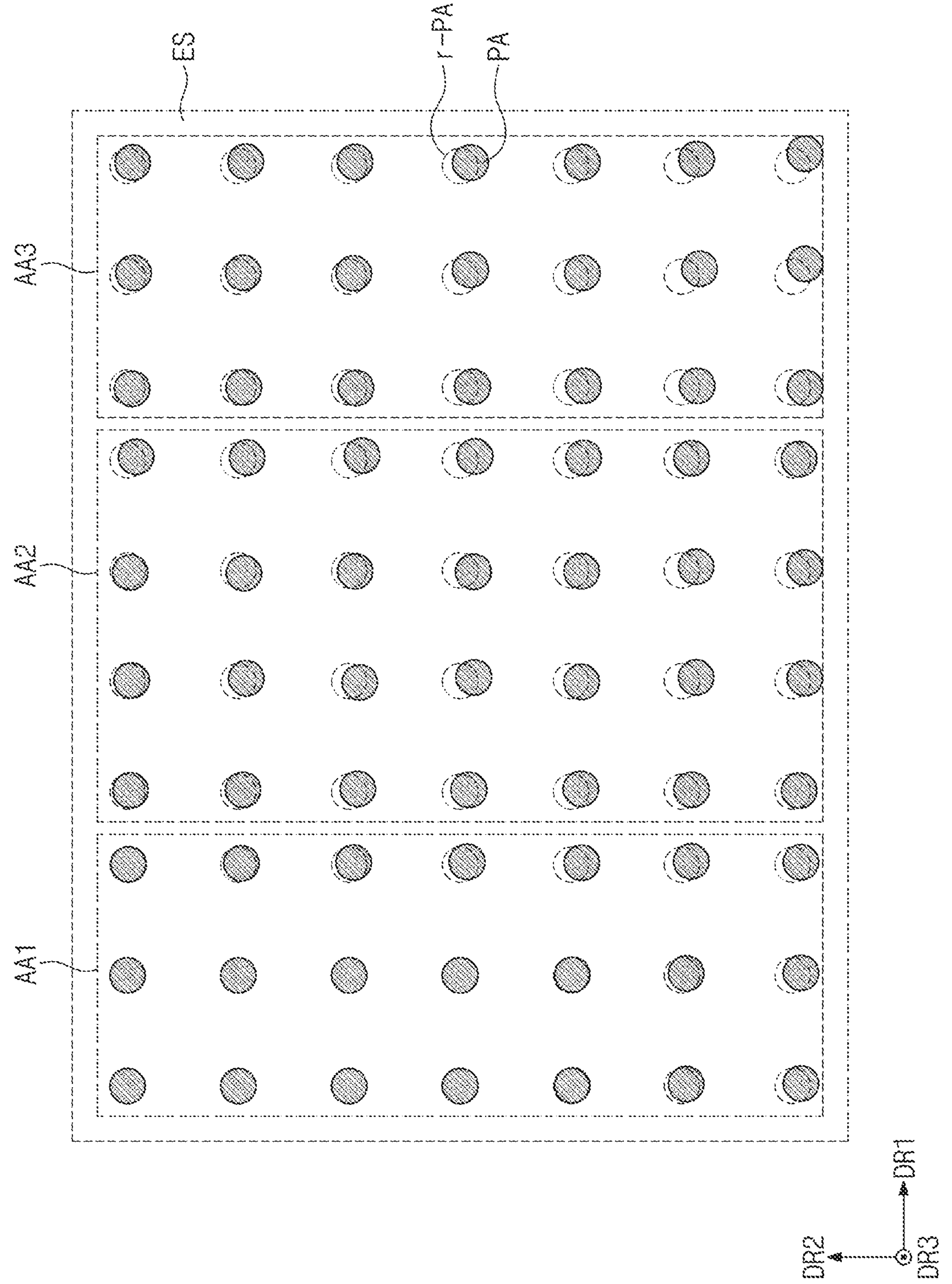
FIG. 7C is a plan view illustrating deposition openings according to an embodiment of the invention.

FIGS. 7A and 7B are plan views illustrating a shape correction method for a mask assembly according to an embodiment of the invention. FIG. 7C is a plan view illustrating deposition openings according to an embodiment of the invention. Differences from the method described with reference to FIGS. 6A to 6C will be mainly described.

Referring to FIG. 7A, a shape correction method for a mask assembly according to an embodiment may include disposing, on a stage ST, a frame MF defining a frame-opening OP-MF therein. Alignment units AU and first to third correction units YU-B, YU-L, and YU-R each individually operated may be disposed on the stage ST.

According to an embodiment, before the disposing of the frame MF on the stage ST, the frame MF may be provided in a state where masks MK are coupled to the frame MF by a welding process. Through the welding process, the masks MK may be coupled to the frame MF, and due to the welding process, welding protrusions WP may be formed on opposite ends of each of the masks MK overlapping the frame MF in a plan view.

Afterwards, the method may include controlling a position of the frame MF on the stage ST through the alignment units AU. The controlling of the position of the frame MF on the stage ST may correspond to those described with reference to FIGS. 6A and 6B.

Thereafter, referring to FIG. 7B, the shape correction method for a mask assembly according to an embodiment may include correcting a shape of the frame MF through the first to third correction units YU-B, YU-L, and YU-R.

The correcting of the shape of the frame MF may include pressing magnetic force parts YP against the frame MF, and providing magnetic forces generated from driving parts DY to the corresponding magnetic force parts YP.

Contracting or expanding operations of extension parts MP may change the shapes of a lower end part P1, a first sidewall part P3, and a second sidewall part P4 closely attached to the magnetic force parts YP, and thus the shape of the frame MF may be corrected. The magnetic force parts YP may each be individually operated, and may contract the frame MF in a direction toward the frame-opening OP-MF, or expand the frame MF.

According to this embodiment, it may be possible to determine whether the shape correction of the frame MF is successful through deposition openings OP-MK included in the masks MK.

Referring to FIG. 7C, deposition patterns PA, with which a formation position of a deposition pattern may be predicted, may be formed on a virtual deposition surface ES. The deposition patterns PA may be formed corresponding to the deposition openings OP-MK of the masks MK. A simulation device or the like may be used to determine whether or not the deposition patterns PA are matched with alignment regions r-PA, and accordingly, it may be possible to determine whether the shape correction of the frame MF is successful.

In an embodiment, for example, the degree by which the deposition patterns PA, formed on the middle right side and middle lower end sections are deviated from the corresponding alignment regions r-PA gradually increases from a first region AA1 to a second region AA2 and a third region AA3. In this case, the correcting of the shape of the frame MF may be performed through the first to third correction units YU-B, YU-L, and YU-R, and repetition of such a process may make it possible to determine whether the deposition patterns PA are matched with the alignment regions r-PA, thereby determining whether the shape correction of the frame MF is successful.

Figure 8:
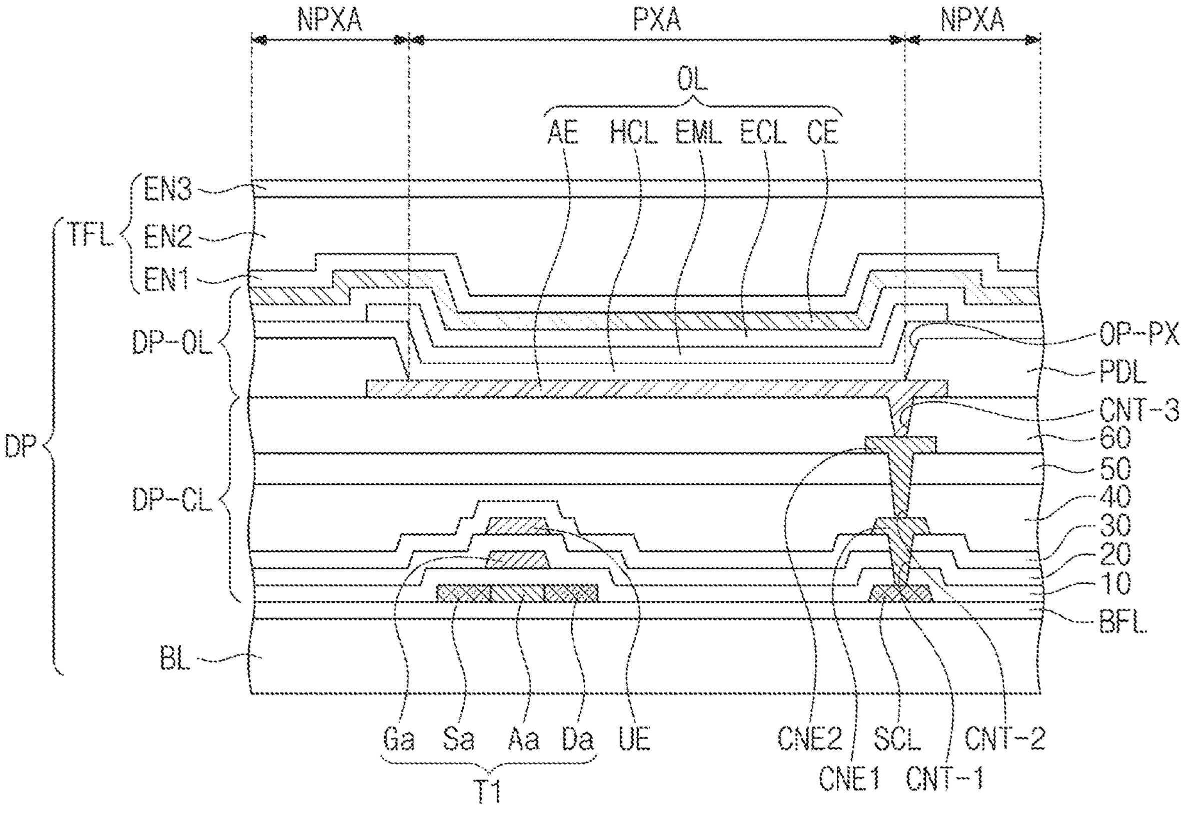
FIG. 8 is a cross-sectional view of a display panel according to an embodiment of the invention.

FIG. 8 is a cross-sectional view of a display panel according to an embodiment of the invention.

In an embodiment, the display panel DP may be a light-emitting display panel. In an embodiment, for example, the display panel DP may be an organic light-emitting display panel, an inorganic light-emitting display panel, or a quantum dot light-emitting display panel. An emission pattern of the organic light-emitting display panel may include an organic light-emitting material, and an emission pattern of the inorganic light-emitting display panel may include an inorganic light-emitting material. An emission pattern of the quantum dot light-emitting display panel may include a quantum dot, a quantum rod, and the like. Hereinafter, the display panel DP may be described as an organic light-emitting display panel.

The display panel DP may include a plurality of pixels. Each of the pixels may include at least one transistor and at least one light-emitting element. FIG. 8 exemplarily illustrates a region, where one transistor T1 and one light-emitting element OL are disposed, among the pixels of the display panel DP. Referring to FIG. 8, the display panel DP may include a base layer BL, a circuit element layer DP-CL, a display element layer DP-OL, and an encapsulation layer TFL.

The base layer BL may provide a base surface on which the circuit element layer DP-CL is disposed. The base layer BL may include a synthetic resin layer. The synthetic resin layer may be formed on a support substrate that is used in manufacture of the display panel DP, and then a conductive layer, an insulation layer, and the like may be formed on the synthetic resin layer. Afterwards, the support substrate may be removed, and the synthetic resin layer from which the support substrate has been removed may correspond to the base layer BL.

At least one inorganic layer may be disposed on an upper surface of the base layer BL. The at least one inorganic layer may include a barrier layer and/or a buffer layer. FIG. 8 exemplarily illustrates a buffer layer BFL disposed on the base layer BL. The buffer layer BFL may improve coupling force between the base layer BL and a semiconductor pattern of the circuit element layer DP-CL.

The circuit element layer DP-CL may be disposed on the buffer layer BFL. The circuit element layer DP-CL may include at least one insulation layer and circuit element. The circuit element may include a signal line, a driving line of a pixel, and the like. The circuit element layer DP-CL may be formed by forming an insulation layer, a semiconductor layer, and a conductive layer through coating, deposition, or the like, and by patterning the insulation layer, the semiconductor layer, and the conductive layer through photolithography.

In an embodiment, the circuit element layer DP-CL may include a transistor T1, a connection signal line SCL, connecting electrodes CNE1 and CNE2, and a plurality of insulation layers 10 to 60. The plurality of insulation layers 10 to 60 may include first to sixth insulation layers 10 to 60 which are stacked in sequence on the buffer layer BFL. The first to sixth insulation layers 10 to 60 may each include either of an inorganic layer or an organic layer.

The transistor T1 may include a gate electrode Ga and a semiconductor pattern including a source region Sa, an active region Aa, a drain region Da. The semiconductor pattern of the transistor T1 may include polysilicon. However, an embodiment of the invention is not limited thereto, and the semiconductor pattern may include amorphous silicon or metal oxide.

The semiconductor pattern may be divided into a plurality of regions according to the conductivity. In an embodiment, for example, the semiconductor pattern may change in electrical properties depending on whether the semiconductor pattern is doped, or whether a metal oxide is reduced. A highly conductive region of the semiconductor pattern may serve as an electrode or a signal line. The highly conductive region may correspond to the source region Sa and the drain region Da of the transistor T1. An undoped or unreduced region having relatively low conductivity may correspond to the active region Aa (or channel region) of the transistor T1.

The connection signal line SCL may be formed from the semiconductor pattern, and disposed on the same layer as the source region Sa, the active region Aa, and the drain region Da of the transistor T1. According to an embodiment, the connection signal line SCL may be electrically connected to the drain region Da of the transistor T1 in a plan view.

The first insulation layer 10 may cover the semiconductor pattern of the circuit element layer DP-CL. The gate electrode Ga may be disposed on the first insulation layer 10. The gate electrode Ga may overlap the active region Aa in a plan view. The gate electrode Ga may function as a mask in a process of doping the semiconductor pattern. An upper electrode UE may be disposed on the second insulation layer 20. The upper electrode UE may overlap the gate electrode Ga in a plan view.

The first connecting electrode CNE1 and the second connecting electrode CNE2 may be disposed between the transistor T1 and the light-emitting element OL to electrically connect the transistor T1 to the light-emitting element OL. The first connecting electrode CNE1 may be disposed on the third insulation layer 30 to be connected to the connection signal line SCL through a contact hole CNT-1 passing through the first to third insulation layers 10 to 30. The second connecting electrode CNE2 may be disposed on the fifth insulation layer 50 to be connected to the first connecting electrode CNE1 through a contact hole CNT-2 passing through the fourth and fifth insulation layers 40 and 50.

The display element layer DP-OL may be disposed on the circuit element layer DP-CL. The display element layer DP-OL may include a light-emitting element OL and a pixel-defining film PDL. A light-emitting opening O-PX may be defined on the pixel-defining film PDL. The light-emitting element OL may include a first electrode AE, a hole transport region HCL, a light-emitting pattern EML, an electron transport region ECL, and a second electrode CE.

The first electrode AE and the pixel-defining film PDL may be disposed on the sixth insulation layer 60. The first electrode AE may be connected to the second connecting electrode CNE2 through a contact hole CNT-3 passing through the sixth insulation layer 60. The pixel-defining film PDL may expose the first electrode AE through the light-emitting opening OP-PX. A portion of the first electrode AE exposed by the light-emitting opening OP-PX may correspond to a light-emitting region PXA. A non-light-emitting region NPXA may surround the light-emitting region PXA.

The hole transport region HCL and the electron transport region ECL may be disposed in common in the light-emitting region PXA and the non-light-emitting region NPXA. The light-emitting pattern EML may be provided in pattern to correspond to the light-emitting opening OP-PX. The light-emitting pattern EML included in the display panel DP may be deposited through the deposition apparatus ED described with reference to FIG. 1. Therefore, the substrate SUB described with reference to FIG. 1 may be a substrate SUB provided in a state where only the components before the light-emitting pattern EML is formed are formed on the display panel DP.

The light-emitting pattern EML may be deposited in a different way from the film-like hole transport region HCL and the film-like electron transport region ECL. The hole transport region HCL and the electron transport region ECL may be formed in common in the pixels using an open mask. The light-emitting pattern EML may be formed differently according to the pixels using a mask referred to as a fine metal mask ("FMM").

The encapsulation layer TFL may include a plurality of thin films. In an embodiment, the encapsulation layer TFL may include first to third thin films EN1, EN2, and EN3 stacked in sequence. The first to third thin films EN1, EN2, and EN3 may each include either of an inorganic film or an organic film. The inorganic film may protect the light-emitting element OL from moisture and/or oxygen. The organic film may protect the light-emitting element OL from foreign substances such as dust particles. However, the configuration of the encapsulation layer TFL is not limited to what is illustrated in FIG. 8 as long as being capable of protecting the light-emitting element OL or improving light-emission efficiency.

According to an embodiment of the invention, since alignment units that control a position of a frame on a stage, and correction units that change a shape of the frame are included, the shape of the large-area frame, which has been deformed, may be easily corrected in a vertical-type deposition apparatus. Accordingly, quality deterioration of masks to be coupled onto the frame may be minimized, and the deposition accuracy may be effectively improved.

Although the embodiments of the invention have been described, it is understood that the invention should not be limited to these embodiments but various changes and modifications can be made by one ordinary skilled in the art within the spirit and scope of the invention as hereinafter claimed.

Therefore, the technical scope of the invention should not be limited to the contents described in the detailed description of the specification, but should be defined by the claims.

What is claimed is:

1. A deposition apparatus comprising:
- a chamber;
- a stage defining a stage-opening therein, and disposed inside the chamber;
- a frame disposed on the stage, and defining a frame-opening therein corresponding to the stage-opening;
- a mask coupled to the frame, and defining a plurality of deposition openings therein corresponding to the frame-opening;
- a deposition source configured to spray a deposition material to the frame-opening;
- alignment units coupled to the stage and contacting the frame to move a position of the frame on the stage; and
- correction units each of which includes a magnetic force part disposed on the stage and adjacent to the frame, and a driving part configured to provide a magnetic force to the magnetic force part, wherein the correction units are configured to change a shape of the frame and are coupled to the stage.

2. The deposition apparatus of claim 1, wherein the magnetic force part is not in contact with the frame in a first mode, and is in contact with a corresponding side of the frame in a second mode, and in the second mode, the magnetic force part contracts the frame in a direction toward the frame-opening, or expands the frame, through the magnetic force provided from the driving part.

3. The deposition apparatus of claim 2, wherein a shape of the frame-opening is changed to correspond to a shape of the frame when the shape of the frame is changed.

4. The deposition apparatus of claim 2, wherein the magnetic forces applied to the respective magnetic force parts are different from each other in strength.

5. The deposition apparatus of claim 1, wherein each of the correction units further comprises an extension part disposed between the magnetic force part and the driving part, and which changes in length on the stage.

6. The deposition apparatus of claim 1, wherein the frame comprises a first part and a second part extending in a first direction and spaced apart from each other in a second direction crossing the first direction, and a third part and a fourth part extending in the second direction and spaced apart from each other in the first direction, and connected to the first part and the second part to define the frame-opening, and some of the correction units are disposed adjacent to the first part to be spaced apart from each other along the first direction.

7. The deposition apparatus of claim 6, wherein others of the correction units are disposed adjacent to the second part to be spaced apart from each other along the second direction, and a remainder of the correction units are disposed adjacent to the third part to be spaced apart from each other along the second direction.

8. The deposition apparatus of claim 7, wherein a length of each of the third part and the fourth part in the second direction is smaller than a length of the first part in the first direction, and a total number of the correction units disposed adjacent to each of the third part and the fourth part is equal to or greater than a total number of the correction units disposed adjacent to the first part.

9. The deposition apparatus of claim 6, wherein the alignment units are disposed on the first part to be spaced apart from each other along the first direction, and the alignment units are each individually operated.

10. The deposition apparatus of claim 9, wherein each of the alignment units moves the frame in the second direction.

11. The deposition apparatus of claim 1, wherein the mask and the frame each comprises Invar.

12. A mask assembly comprising:

a stage defining a stage-opening therein;

a frame disposed on the stage, and defining a frame-opening therein corresponding to the stage-opening;

a mask coupled to the frame, and defining a plurality of deposition openings therein corresponding to the frame-opening;

alignment units coupled to the stage; and correction units each of which includes a magnetic force part disposed on the stage to be adjacent to the frame, and a driving part configured to provide a magnetic force to the magnetic force part, wherein the correction units are coupled to the stage, wherein the alignment units move a position of the frame on the stage, and the correction units change a shape of the frame.

13. The mask assembly of claim 12, wherein the magnetic force part is not in contact with the frame in a first mode, and is in contact with a corresponding side of the frame in a second mode, and in the second mode, the magnetic force part contracts the frame in a direction toward the frame-opening, or expands the frame, through the magnetic force provided from the driving part.

14. The mask assembly of claim 13, wherein a shape of the frame-opening is changed to correspond to a shape of the frame when the shape of the frame is changed.

* * * * *